United States Patent
Sawada et al.

(10) Patent No.: US 9,373,762 B2
(45) Date of Patent: Jun. 21, 2016

(54) ELECTRONIC PART PACKAGE

(71) Applicant: Panasonic Intellectual Property Management Co., Ltd., Osaka (JP)

(72) Inventors: Susumu Sawada, Osaka (JP); Yoshihiro Tomita, Osaka (JP); Koji Kawakita, Nara (JP); Masanori Nomura, Aichi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/730,200

(22) Filed: Jun. 3, 2015

(65) Prior Publication Data
US 2015/0364661 A1 Dec. 17, 2015

(30) Foreign Application Priority Data

Jun. 17, 2014 (JP) ................. 2014-124582

(51) Int. Cl.
| | |
|---|---|
| *H01L 33/54* | (2010.01) |
| *H01L 33/62* | (2010.01) |
| *H01L 21/302* | (2006.01) |
| *H01L 21/461* | (2006.01) |
| *H01L 33/60* | (2010.01) |
| *H01L 23/00* | (2006.01) |

(52) U.S. Cl.
CPC .............. *H01L 33/54* (2013.01); *H01L 24/96* (2013.01); *H01L 33/60* (2013.01); *H01L 33/62* (2013.01); *H01L 2224/18* (2013.01); *H01L 2924/1815* (2013.01)

(58) Field of Classification Search
CPC ....... H01L 33/647; H01L 33/58; H01L 33/62; H01L 33/56; C23C 14/34; C23C 14/5846
USPC ........................................................ 257/713
See application file for complete search history.

(56) References Cited

U.S. PATENT DOCUMENTS

| | | | |
|---|---|---|---|
| 2005/0012032 A1* | 1/2005 | Onodera | ............. H01L 21/4832 250/214.1 |
| 2006/0183269 A1 | 8/2006 | Fuergut et al. | |
| 2007/0267136 A1 | 11/2007 | Tuominen et al. | |

(Continued)

FOREIGN PATENT DOCUMENTS

| | | |
|---|---|---|
| JP | 8-255870 | 10/1996 |
| JP | 2004-103860 | 4/2004 |
| JP | 2008-522396 | 6/2008 |

(Continued)

*Primary Examiner* — Evan Pert
*Assistant Examiner* — Changhyun Yi
(74) *Attorney, Agent, or Firm* — Renner, Otto, Boisselle & Sklar, LLP

(57) ABSTRACT

An electronic part package comprises a sealing resin layer, an electronic part and a metal plating pattern layer. The sealing resin layer is provided with a principal surface including a first region that has a bellows-like shape having alternate ridges and valleys and a second region that is flat. The electronic part includes an electrode having a principal surface and is covered by the sealing resin layer except the principal surface, which is surrounded by the second region. The metal plating pattern layer is integrally provided on the first and second regions and on the principal surface of the electrode. A portion of the metal plating pattern layer, the portion located on the first region, has a bellows-like shape having alternate ridges and valleys along an outline of the first region.

7 Claims, 8 Drawing Sheets

(56) References Cited

U.S. PATENT DOCUMENTS

2009/0160043 A1 6/2009 Shen et al.
2012/0153507 A1 6/2012 Miki et al.

FOREIGN PATENT DOCUMENTS

| | | |
|---|---|---|
| JP | 2012-134270 | 7/2012 |
| WO | 2014/034024 | 3/2014 |

* cited by examiner

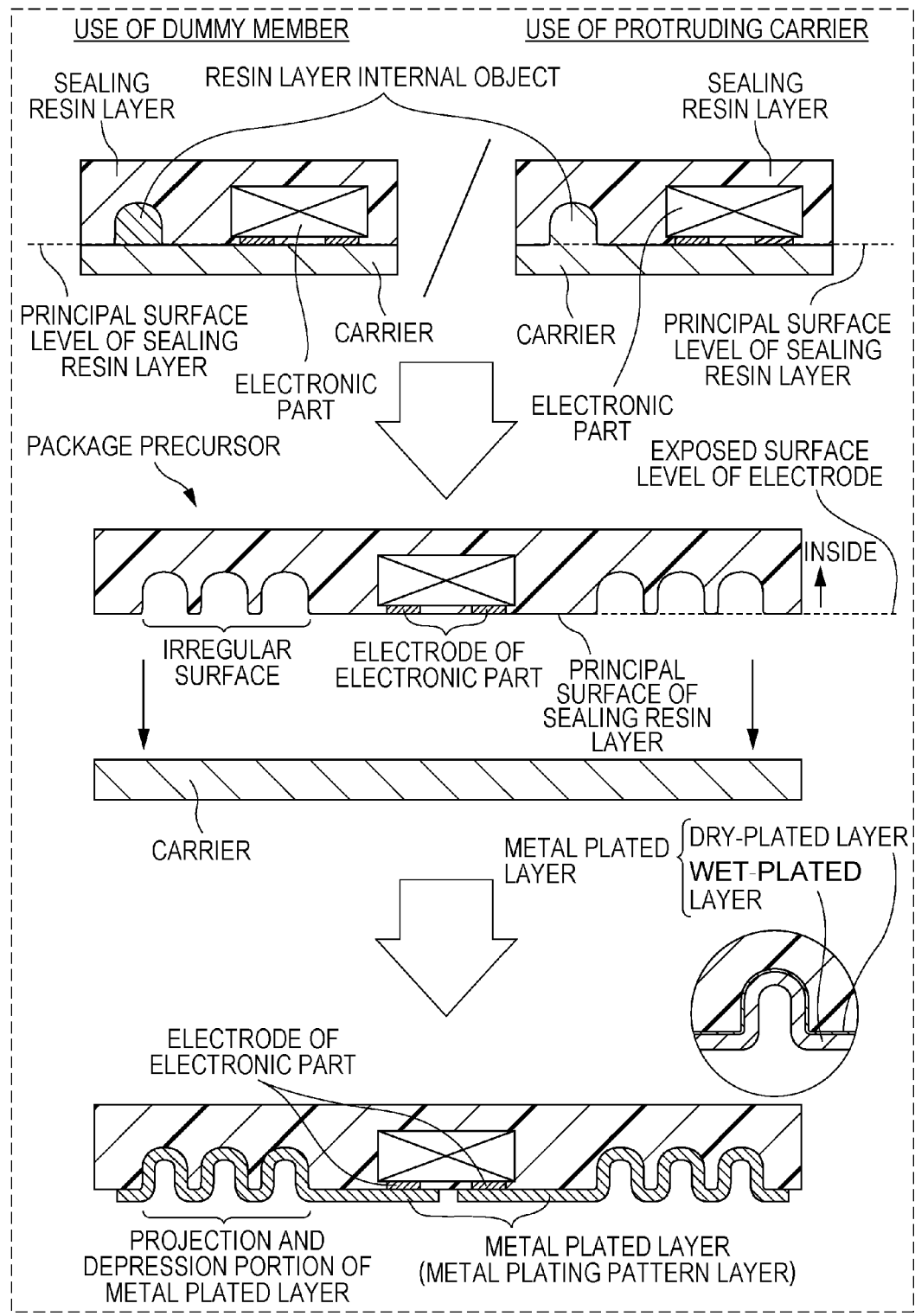

FIG. 2A
FIG. 2B
FIG. 2C
FIG. 2D
FIG. 2E
FIG. 2F
FIG. 2G
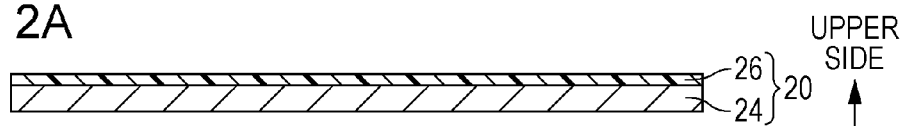
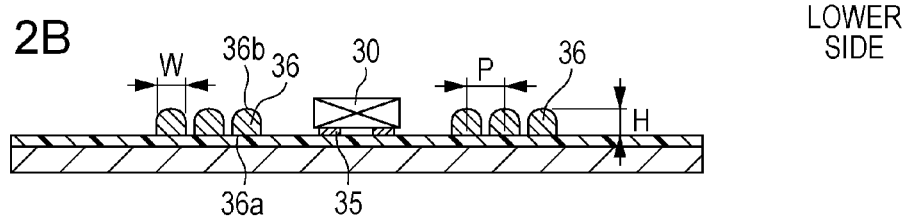
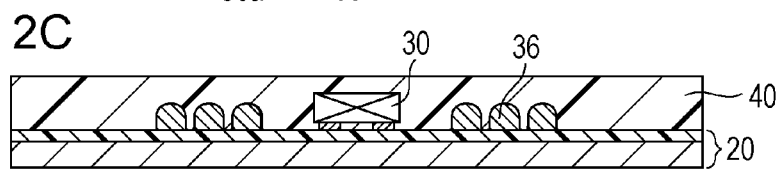
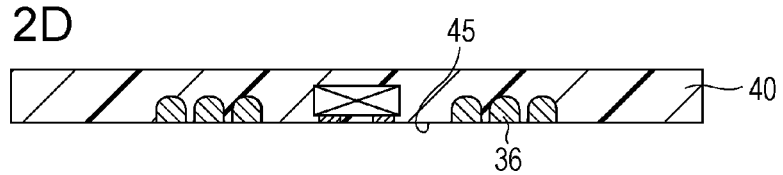
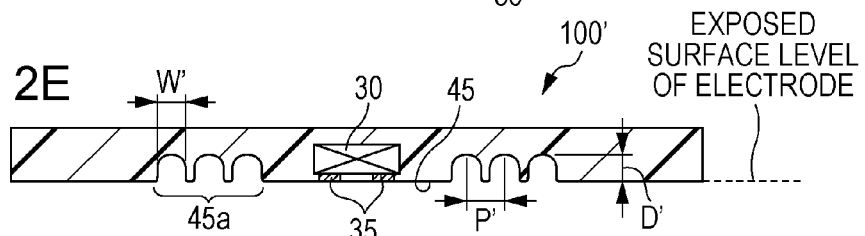
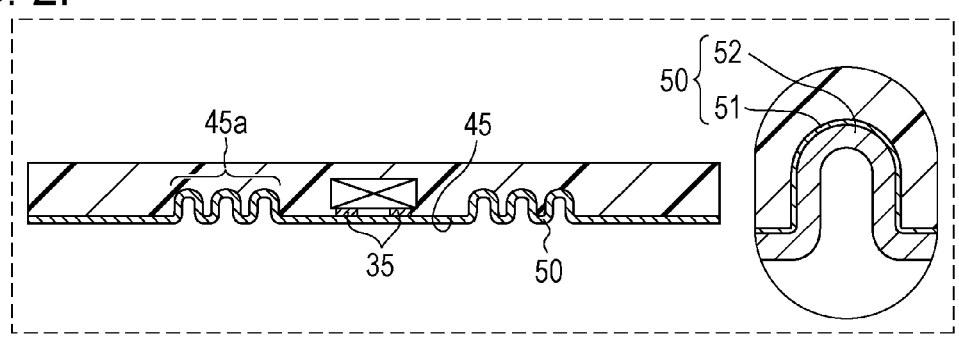
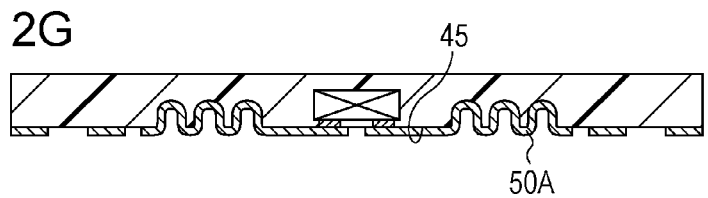

UPPER SIDE
↕
LOWER SIDE

DICING PROCESSING

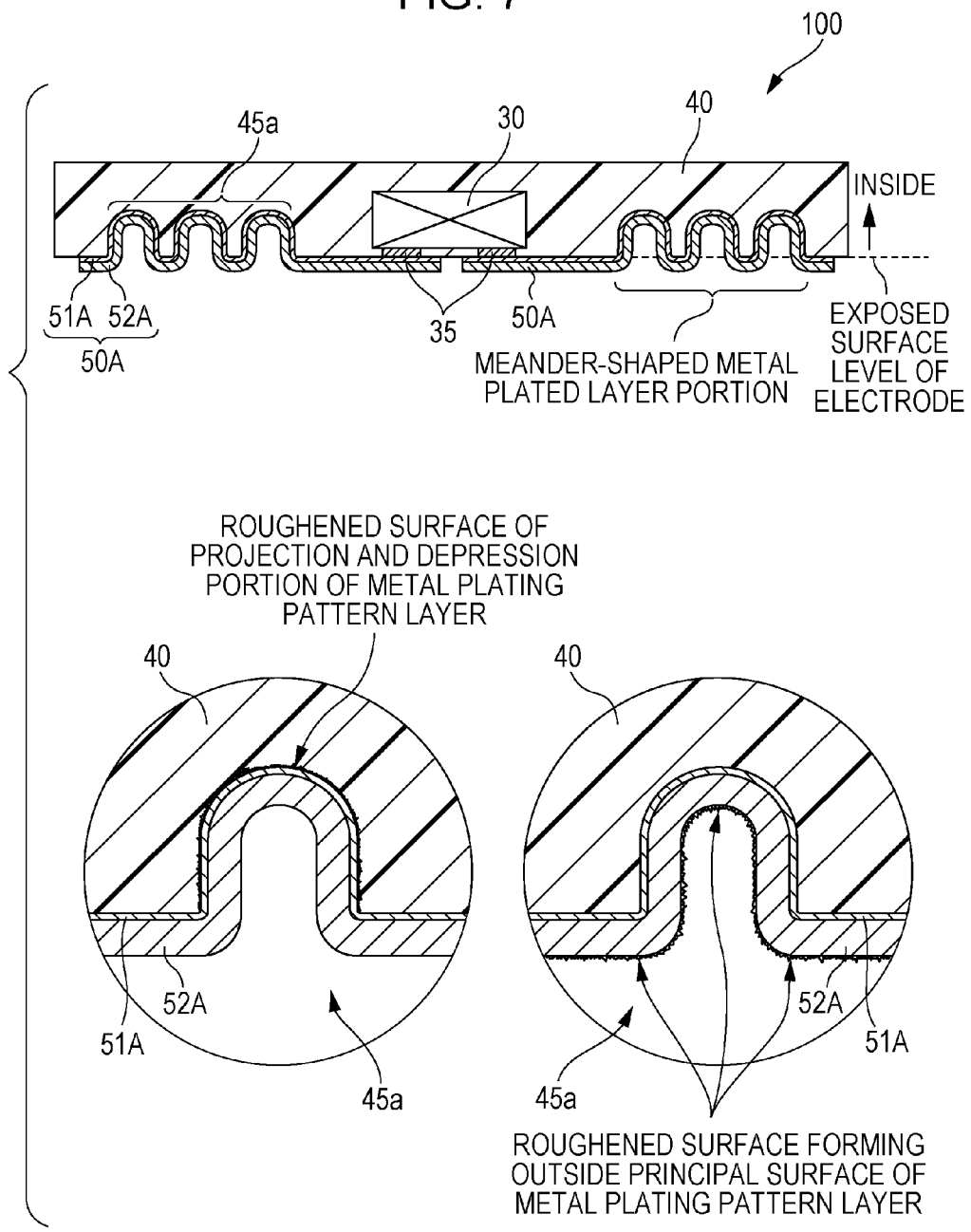

ELECTRONIC PART PACKAGE

BACKGROUND

1. Technical Field

The present disclosure relates to a package provided with an electronic part, the package which is used in an electronics field.

2. Description of the Related Art

With the progress of electronic equipment, various mounting technologies are developed in the electronics field. As the packaging technology for mounting electronic parts such as an IC and an inductor, there is the mounting technology using a circuit substrate or a lead frame. That is, as the package configuration of a common electronic part, there are "a package using a circuit substrate", "a package using a lead frame", and so forth (see U.S. Pat. No. 7,927,922, U.S. Pat. No. 7,202,107, and International Application Publication No. WO2006/056643).

SUMMARY

One non-limiting and exemplary embodiment provides an electronic part packaging technology that implements an improvement in connection reliability.

In one general aspect, the techniques disclosed here feature an electronic part package including a sealing resin layer, an electronic part, and a metal plating pattern layer. The sealing resin layer includes a principal surface including a first region that has a bellows-like shape having alternate ridges and valleys and a second region that is flat. The electronic part includes an electrode having a principal surface and is covered by the sealing resin layer except the principal surface of the electrode. The principal surface of the electrode is surrounded by the second region. The metal plating pattern layer is integrally provided on the first and second regions of the principal surface of the sealing resin layer and on the principal surface of the electrode. A portion of the metal plating pattern layer, the portion on the first region, has a bellows-like shape having alternate ridges and valleys along the outline of the first region.

According to the present disclosure, the connection reliability can be improved.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a sectional view schematically depicting the concept of a method for producing an electronic part package according to the present disclosure;

FIGS. 2A to 2G are process sectional views schematically depicting the method for producing an electronic part package of the present disclosure according to a first embodiment;

FIG. 7 is a sectional view schematically depicting the configuration of the electronic part package of the present disclosure.

DETAILED DESCRIPTION (Underlying Knowledge Forming Basis of the Present Disclosure)

Figure 8A:
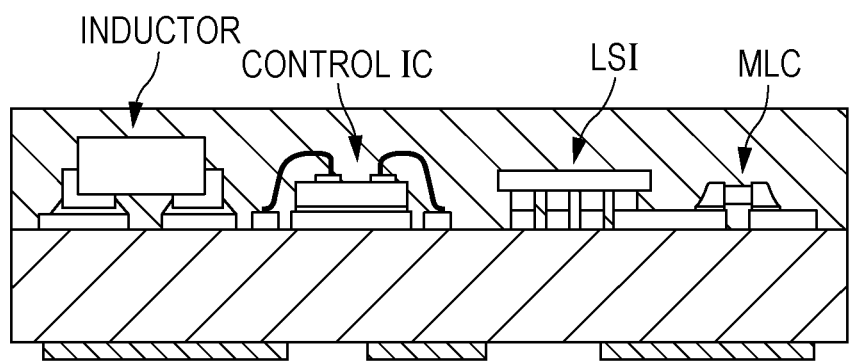
FIGS. 8A and 8B are sectional views schematically depicting the configuration of the electronic part package.
Figure 8B:
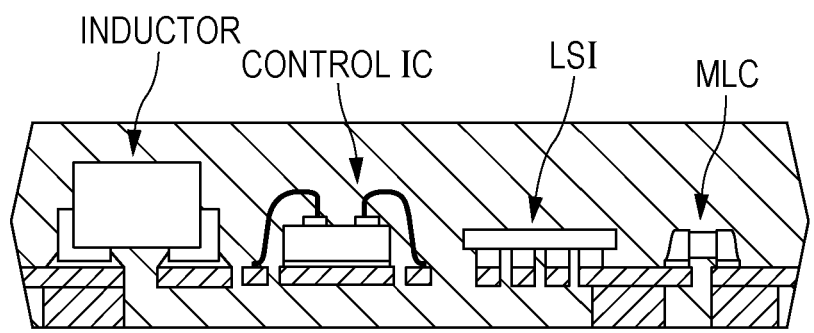

"A package using a circuit substrate" (see FIG. 8A) has a form in which an electronic part is mounted on a circuit substrate. As the type of such a package, generally, there are a wire bonding type (W/B type) and a flip chip type (F/C type). A "lead frame type" (see FIG. 8B) has a form including a lead frame formed of a lead, a die pad, and so forth. In both the package using a circuit substrate and the lead frame-type package, various kinds of electronic parts are bonded by soldering or the like. The inventors have found out that the following problems arise in these packaging technologies.

Although "the package using a circuit substrate" (see FIG. 8A) can implement high-density mounting, since "the package using a circuit substrate" uses a circuit substrate, there is still a problem remaining in terms of heat radiation performance. Moreover, substrate cost itself cannot be ignored, and "the package using a circuit substrate" is not necessarily satisfying in terms of cost. Furthermore, the cost of performing wire bonding or flip-chip packaging also cannot be ignored. For example, flip-chip packaging needs an expensive mounter. Thus, a further reduction in cost is required.

The "lead frame type" (see FIG. 8B) is not suitable for a reduction in size of a package by high-density mounting because it is difficult to perform fine processing in a lead frame. Furthermore, since soldering is performed in both the package using a circuit substrate and the lead frame type, if the entire portion is sealed with resin, it is necessary to deal with a problem of so-called "solder flash". Therefore, both the package using a circuit substrate and the lead frame type are not necessarily satisfying in terms of connection reliability. Solder flash is a phenomenon in which a solder material used to join the parts in a package is melted again at the time of heating in soldering for module mounting and the melted solder material enters a fine gap (that is, flash) or causes a short circuit.

That is, the existing mounting technologies have a problem of inadequate connection reliability and heat dissipation characteristics.

In view of these circumstances, the present disclosure provides a packaging technology that achieves desirable connection reliability and heat dissipation characteristics and contributes to size reduction in high-density mounting.

For this purpose, the inventors have tried to solve the above-described problems by addressing the problems from a new direction, not by dealing with the problems in a manner which is an extension of the existing technology. As a result, the inventors have obtained an electronic part package and a method for producing the electronic part package of the present disclosure.

According to an aspect of the present disclosure, since a metal plated layer/metal plating pattern layer is directly joined to an electrode of an electronic part which is exposed from a sealing resin layer and the metal plated layer/metal plating pattern layer is provided also on an irregular surface of the sealing resin layer, the connection reliability and the heat dissipation characteristics can be improved.

In the present disclosure, "irregular" includes a bellows-like shape having alternate ridges and valleys. Moreover, in the present disclosure, the bellows-like shape is sometimes called a meander shape.

Specifically, in an aspect of the present disclosure, a method for producing an electronic part package is provided. In the method, after an electronic part is placed and a sealing resin layer is formed on a carrier, the carrier is separated and removed. Thereby, a package precursor is obtained in which the electronic part is buried in the sealing resin layer in such a way that an electrode of the electronic part is exposed at a principal surface of the sealing resin layer. At least one "resin layer internal object" extending from a principal surface level of the sealing resin layer (that is, a principal surface level of the sealing resin layer at which the electrode of the electronic part is to be exposed) to the inside (that is, the inside of the sealing resin layer) is provided before the separation and removal of the carrier. The resin layer internal object is removed after the separation and removal of the carrier. Thereby, an irregular surface is formed on the principal surface of the sealing resin layer. Metal plating processing is performed all over the principal surface of the sealing resin layer after the separation and removal of the carrier. Thereby, a metal plated layer is joined to the electrode exposed from the sealing resin layer and the metal plated layer is provided on the irregular surface.

One of the features of such a method for producing an electronic part package according to the aspect of the present disclosure is "the formation of a sealing resin layer irregular surface by using a resin layer internal object" and "the formation of a metal plated layer on an irregular surface, the metal plated layer which is joined to an exposed electrode surface". That is, in this production method, at least one resin layer internal object is provided before the separation and removal of the carrier. The resin layer internal object is removed after the separation and removal of the carrier, whereby an irregular surface is formed on the principal surface of the sealing resin layer. Metal plating processing is performed after the separation and removal of the carrier, whereby a metal plated layer which is joined to the electrode exposed from the sealing resin layer is formed on the irregular surface of the sealing resin layer.

Moreover, in the present disclosure, an electronic part package obtained by the above-described production method is also provided. Such an electronic part package includes: a sealing resin layer; an electronic part buried in the sealing resin layer; and a metal plating pattern layer provided on the sealing resin layer. An electrode of the electronic part is exposed at a principal surface of the sealing resin layer, and the principal surface of the sealing resin layer at which the electrode is exposed has an irregular surface. A metal plating pattern layer is provided on the irregular surface of the sealing resin layer and is joined to the electrode of the electronic part. The metal plating pattern layer has a laminated structure formed of a dry-plated layer which is positioned relatively inside and a wet-plated layer which is positioned relatively outside.

One of the features of such an electronic part package according to an aspect of the present disclosure is "an irregular surface formed on a sealing resin layer principal surface at which an electrode of an electronic part is exposed" and "a metal plating pattern layer having a laminated structure formed of a dry-plated layer and a wet-plated layer", the metal plating pattern layer which is directly joined to an exposed electrode surface and is positioned on the irregular surface". That is, in this electronic part package, the electrode of the electronic part is exposed at the principal surface of the sealing resin layer in a flush state and the principal surface of the sealing resin layer at which the electrode is exposed has an irregular surface. The metal plating pattern layer is provided on the irregular surface of the sealing resin layer and is directly joined to the electrode exposed surface of the electronic part. The metal plating pattern layer has "a laminated structure formed of a dry-plated layer which is positioned relatively inside and a wet-plated layer which is positioned relatively outside".

Moreover, an electronic part package according to another aspect of the present disclosure includes a sealing resin layer, an electronic part, and a metal plating pattern layer. The sealing resin layer has a principal surface including a bellows-shaped first region having alternate ridges and valleys and a flat second region. The electronic part includes an electrode and is buried in the sealing resin layer in such a way that a principal surface of the electrode is exposed from the second region. The metal plating pattern layer is integrally provided on the first and second regions of the principal surface of the sealing resin layer and on the principal surface of the electrode. A portion of the metal plating pattern layer, the portion on the first region, has a bellows-like shape having alternate ridges and valleys along the outline of the first region.

With the above-described configuration, the metal plating pattern layer has the bellows-like shape on the first region, the bellows-like shape having alternate ridges and valleys along the outline of the first region. Therefore, the electronic part package easily expands and contracts. Moreover, the metal plating pattern layer is integrally provided on the first and second regions of the principal surface of the sealing resin layer and on the principal surface of the electrode. Therefore, there is no connection interface between the portion on the first region, the portion on the second region, and the portion on the principal surface of the electrode of the electronic part package. This makes it possible to avoid a problem of the concentration of stress at the connection interface, the stress which is applied when the electronic part package expands and contracts, and the connection reliability is improved.

The metal plating pattern layer may be a layer covering the whole of the first region or may be a layer covering part of the first region. Therefore, the area of the bellows-like shape of the metal plating pattern layer may substantially coincide with the area of the bellows-like shape of the sealing resin layer or may be smaller than the area of the bellows-like shape of the sealing resin layer. For example, the width (that is, the length of a ridge) of the bellows-like shape of the metal plating pattern layer may be narrower than the width (that is, the length of a ridge) of the bellows-like shape of the sealing resin layer. Moreover, the width of the bellows-like shape of the metal plating pattern layer and the width of the bellows-like shape of the sealing resin layer may be fixed or may vary depending on the position. That is, a plurality of ridges of the bellows-like shape of the metal plating pattern layer may have the same length or may have different lengths. Furthermore, a plurality of ridges of the bellows-like shape of the sealing resin layer may have the same length or may have different lengths. In addition, the ridges of the bellows-like shape of the sealing resin layer and the ridges of the bellows-like shape of the metal plating pattern layer may have a shape in which the ridges extend straight or may have a curved shape.

The second region of the principal surface of the sealing resin layer and the principal surface of the electrode may be located in the same plane. Moreover, a portion of the metal plating pattern layer other than the portion on the first region may be located in the same plane so as to face the second region of the sealing resin layer and the principal surface of the electrode.

With the above-described configuration, the principal surface of the electrode and the second region of the principal surface of the sealing resin layer are located in the same plane, and the portion of the metal plating pattern layer other than the portion on the first region is located in the same plane in such a way as to face the second region of the sealing resin layer and the principal surface of the electrode. Therefore, a portion of the metal plating pattern layer, the portion on the electrode, and a portion of the metal plating pattern layer, the portion on the second region, connect to each other without a difference in level. This makes it possible to avoid a problem of the concentration of stress at a step portion, the stress which is applied when the electronic part package expands and contracts, and the connection reliability is improved.

The bellows-like shape of the first region of the sealing resin layer may be locally recessed toward the inside of the sealing resin layer to a level lower than the second region. Moreover, the metal plating pattern layer may include a wet-plated layer and a dry-plated layer which is located nearer to the sealing resin layer than the wet-plated layer. The dry-plated layer may be a layer containing at least one type of metal material selected from a group consisting of Ti, Cr, and Ni. The wet-plated layer may be a layer containing at least one type of metal material selected from a group consisting of Cu and Al. The electronic part may be a light-emitting device. The sealing resin layer may be a transparent resin layer. The dry-plated layer may be a reflecting layer.

As described above, according to the aspect of the present disclosure, it is possible to achieve desirable heat dissipation characteristics and connection reliability.

As for "heat dissipation characteristics", in the aspect of the present disclosure, mounting using wire bonding or a bump is not performed (that is, the package is wire bonding-less and bumpless), and the heat from the electronic part is efficiently dissipated through the metal plated layer/metal plating pattern layer. Since the metal plated layer/metal plating pattern layer can be formed of a material having high thermal conductivity such as copper and can be provided as a "thick layer", it is possible to release heat efficiently to the outside through the metal plated layer/metal plating pattern layer. In particular, in the present disclosure, since it is possible to form "a metal plated layer/metal plating pattern layer having projections and depressions", it is possible to achieve both "further improved heat dissipation characteristics" and "high-density mounting" in one package. That is, an electronic part that is required to perform multiple pin connection at a narrow pitch has limited packaging area and wiring area. In such an electronic part, the metal plating pattern layer is made to have fine patterns having projections and depressions (that is, the wiring width and the inter-wiring width by the metal plating pattern layer are narrowed). This makes it possible to achieve "high-density characteristics of the metal plating pattern layer". Furthermore, since the surface area is increased by providing the metal plating pattern layer having projections and depressions so as to extend to an inside region of the sealing resin layer, it is possible to achieve "further improved heat dissipation characteristics through the metal plating pattern layer".

Moreover, the metal plated layer/metal plating pattern layer having projections and depressions can lengthen the wiring length in the same wiring placement area as compared to "a wiring layer having no projections and depressions". That is, it is possible to implement "a metal plated layer/metal plating pattern layer that can control the wiring length". This means that it becomes possible to design an appropriate wiring length that copes with a problem of signal delay by using the projections and depressions.

Furthermore, in the present disclosure, it is possible to make the metal plated layer/metal plating pattern layer having projections and depressions function as wiring which is required to have the function of bending and stretching like a flexible device and a stretchable device. Thus, the metal plated layer/metal plating pattern layer having projections and depressions has the advantage over "the wiring having no projections and depressions".

In the aspect of the present disclosure, packaging is achieved without performing "soldering". That is, a package without the use of a "solder material" is implemented. As a result, "solder flash" is avoided, and "connection reliability" can be improved in that respect. In particular, when stress of bending or stretching is applied, the absence of "a substance mediating connection such as a solder material" between the wiring and the electrode reduces the possibility of the occurrence of poor connection caused by a connection interface fracture.

In addition, the package according to the aspect of the present disclosure has a "substrateless structure". Since this "substrateless structure" does not use a substrate, it is possible to reduce the thickness of the entire package. This makes it possible to provide flexibility to the entire package. In other words, it is possible to improve the stretchability of the entire package. Moreover, the fact that a substrate is not used contributes to low-cost production. Furthermore, since packaging can be performed in a simple process as compared to wire bonding, flip-chip packaging, or the like, cost reduction can be achieved in that respect.

Hereinafter, the electronic part package and the method for producing the electronic part package according to the aspect of the present disclosure will be described in detail. Various elements in the drawings are schematically depicted only for the understanding of the present disclosure, and the sizes (that is, the lengths, widths, thicknesses, and so forth), appearances, dimensional ratios, and so forth thereof in the drawings may be different from the actual sizes, appearances, dimensional ratios, and so forth thereof.

A "direction" which is directly or indirectly described in this specification is a direction based on the positional relationship between an electronic part 30 and an electrode 35 thereof, for example, and a "vertical direction" corresponds to the vertical direction in the drawings. Specifically, a "vertical direction" corresponds to the "vertical direction" in each drawing, and a side on which the electrode 35 is provided with reference to the electronic part 30 is referred to as a "lower side" and a side opposite to that side is referred to as an "upper side".

[Production Method of the Present Disclosure]

First, the method for producing the electronic part package according to the present disclosure will be described. As depicted in FIG. 1, in the production method of the present disclosure, at least one resin layer internal object is provided before the separation and removal of a carrier. Then, the resin layer internal object is removed after the separation and removal of the carrier, whereby an irregular surface is formed on a principal surface of the sealing resin layer. Moreover, by performing metal plating processing all over the principal surface of the sealing resin layer after the separation and removal of the carrier, "a metal plated layer which is joined to an electrode exposed from the sealing resin layer" is formed in such a way as to reach the irregular surface of the sealing resin layer.

Specifically, first, "by separating and removing a carrier after placing an electronic part and forming a sealing resin layer on the carrier, a package precursor in which the electronic part is buried in the sealing resin layer in such a way that an electrode of the electronic part is exposed at a principal surface of the sealing resin layer" is obtained. Here, when such a package precursor is obtained, a "resin layer internal object" is used. In particular, the "resin layer internal object" is provided at the time of formation of the sealing resin layer, and the "resin layer internal object" is integrated with the sealing resin layer on the carrier. As a result, when the carrier is then separated and removed, an irregular surface is formed on the sealing resin layer. That is, it is possible to obtain a package precursor in which the irregular surface is formed on the principal surface of the sealing resin layer.

The resin layer internal object is provided in such a way as to extend from a principal surface level of the sealing resin layer (that is, a principal surface level at which the electrode of the electronic part is to be exposed) to the inside of the sealing resin layer. That is, the "resin layer internal object" is provided so as to be interposed between the sealing resin layer and the carrier. The number of such "resin layer internal objects" is not limited to one and may be two or more. In particular, it is desirable that a plurality of "resin layer internal objects" are provided in such a way as to lie next to each other. That is, it is desirable that a plurality of resin layer internal objects are provided side by side in such a way as to have an array arrangement configuration.

In this specification, the "resin layer internal object" means a member which is placed inside the sealing resin layer when a package precursor is obtained and, in particular, means a member which is placed inside the sealing resin layer in such a way as to extend from "a sealing resin layer principal surface level at which the electrode of the electronic part is to be exposed" to "the inside of the sealing resin layer". Such a resin layer internal object contributes to the formation of an irregular surface of the sealing resin layer. In other words, the "resin layer internal object" in the present disclosure is a member that is buried in the sealing resin layer on the carrier in order to obtain a package precursor in which an irregular surface is formed on the principal surface of the sealing resin layer.

Moreover, the "carrier" in this specification means a member that is used as a support in the placement of an electronic part and the formation of a sealing resin layer and is eventually separated and removed. The carrier may be a sheet-like member and may be, for example, a sheet-like member having any one of adherence and flexibility or both.

As depicted on an upper left side of FIG. 1, the placement of the "resin layer internal object" may be performed by placing at least one dummy member on a carrier. That is, after an electronic part and a dummy member are placed on a carrier, a sealing resin layer is formed on the carrier so as to cover the electronic part and the dummy member, whereby it is possible to provide the dummy member in the sealing resin layer as the resin layer internal object.

Moreover, as depicted on an upper right side of FIG. 1, the placement of the "resin layer internal object" may be performed by using "a protruding carrier provided with at least one projection" as a carrier. That is, by placing an electronic part on "a protruding carrier provided with at least one projection" and then forming a sealing resin layer on the protruding carrier in such a way as to cover the electronic part, it is possible to provide a protrusion of the protruding carrier in the sealing resin layer as a resin layer internal object.

As depicted in the middle of FIG. 1, desirably, an irregular surface which is formed on the principal surface of the sealing resin layer of the package precursor may have a form in which the irregular surface is recessed toward the inside of the sealing resin layer. That is, as the irregular surface, it is desirable to form a surface in which the principal surface of the sealing resin layer is locally recessed toward the inside to a level lower than an exposed surface level of the electrode. This means that part of the sealing resin layer principal surface at which the electrode of the electronic part is to be exposed forms projections and depressions by being recessed toward the inside without jutting out. Since the irregular surface is formed due to the presence of the resin layer internal object, the outline of the irregular surface can reflect the shape of the resin layer internal object. Therefore, by appropriately adjusting the shape, size, placement, and so forth of the resin layer internal object, it is possible to form a fine irregular surface and effectively increase the surface area of the sealing resin layer principal surface.

For example, by using a ridge-shaped "resin layer internal object" extending in a direction perpendicular to a cross section depicted in FIG. 1, it is possible to form a bellows-shaped irregular surface having alternate ridges and valleys on a principal surface of a resin layer. The ridge-shaped resin layer internal object may have a shape in which the ridge-shaped resin layer internal object extends linearly or may have a curved shape. When a plurality of ridge-shaped resin layer internal objects are used, the plurality of resin layer internal objects may have different lengths in a direction in which the ridges extend. As depicted in FIG. 1, the principal surface of the resin layer is formed in such a way as to include a region with an irregular surface and a flat region. The electrode of the electronic part is exposed from the flat region of the principal surface of the resin layer.

In the production method of the present disclosure, metal plating processing is performed all over the principal surface of the sealing resin layer after the separation and removal of the carrier. As a result, as depicted in the bottom of FIG. 1, it is possible to join the metal plated layer to the electrode exposed from the sealing resin layer and provide the metal plated layer on the irregular surface. That is, the metal plated layer formed on the sealing resin layer principal surface is joined to the electrode of the electronic part, the electrode exposed from the sealing resin layer, and is positioned on the irregular surface formed on the principal surface of the sealing resin layer. Since the metal plated layer positioned on the irregular surface of the sealing resin layer may have projections and depressions, the surface area of the metal plated layer can be increased as a whole. Such a metal plated layer can effectively contribute to the improved heat dissipation characteristics of the electronic part package. Specifically, the heat generated by the electronic part is dissipated through the metal plated layer, and, since the surface area of the metal plated layer is increased due to the "projections and depressions", the heat is efficiently dissipated. In particular, in the present disclosure, since the projection and depression portion of the metal plated layer extends in such a way as to dig into the inside of the sealing resin layer, the metal plated layer with a larger surface area is implemented without a substantial increase in the size of the entire package.

As depicted in the drawing, as the metal plated layer, it is desirable to form a layer having a meander shape along the outline of the irregular surface. To put it briefly, it is desirable that the metal plated layer formed on the irregular surface of the sealing resin layer has a shield-shaped meander structure.

That is, it is desirable that the projection and depression portion of the metal plated layer has a form similar to the outline shape of the irregular surface of the sealing resin layer and has a form in which the projection and depression portion "meanders" in a sectional view (a sectional view obtained by performing cutting in the thickness direction of the package). With such a meander shape, the surface area of the metal plated layer can be increased more effectively.

As the metal plating processing, it is desirable to perform a wet-plating method after performing a dry plating method. That is, it is desirable to form a dry-plated layer by performing the dry plating method all over the principal surface of the sealing resin layer at which an electrode surface of the electronic part is exposed and then form a wet-plated layer by performing the wet-plating method all over the principal surface of the dry-plated layer. Such a plating process has the following process feature: "forming a metal layer directly on the electrode exposed surface of the electronic part". It is possible to provide a thick wet-plated layer. As a result of performing the dry plating method, it is possible to form a thick plated layer with good adhesion in the subsequent wet-plating method. In particular, in the present disclosure, direct formation of such a thick metal plated layer is performed on a principal surface of a sealing resin layer 40 (that is, a principal surface at which an electrode surface of an electronic part is exposed, the principal surface on which a projection and depression portion is provided). The thick metal plated layer provided in this manner contributes to the improved heat dissipation characteristics of a package along with an increase in the surface area due to the "projections and depressions".

Hereinafter, with reference to the drawings in which more specific process modes are depicted, the production method of the present disclosure will be described. First, a first embodiment will be taken up as a representative process example and the description will be given based on the first embodiment.

(First Embodiment)

Manufacturing method processes of the present disclosure according to the first embodiment are depicted in FIGS. 2A to 2G and FIGS. 3A to 3C.

First, package precursor formation processes are performed. It is desirable that the formation of such a package precursor includes (i) a process of placing an electronic part and a dummy member on an adhesive carrier in such a way as to be attached to the adhesive carrier which is used as a carrier, (ii) a process of forming a sealing resin layer on the adhesive carrier in such a way as to cover the electronic part and the dummy member, and (iii) a process of making an electrode of the electronic part exposed at a principal surface of the sealing resin layer by separating and removing the adhesive carrier from the sealing resin layer and removing the dummy member and forming an irregular surface on the principal surface of the sealing resin layer at which the electrode is exposed.

The following is a specific explanation. First, as depicted in FIGS. 2A and 2B, at least one type of electronic part 30 and at least one dummy member 36 are placed on an adhesive carrier 20. That is, the electronic part 30 and the dummy member 36 are mounted on the adhesive carrier 20. It is desirable that such placement of the electronic part 30 and the dummy member 36 is performed in such a way that an electrode portion 35 of the electronic part 30 and a lower side face 36a of the dummy member 36 make contact with the adhesive carrier 20. By so doing, it is possible to make the electrode 35 of the electronic part 30 and the dummy member 36 exposed in a flush state by the subsequent carrier separation.

Any type of electronic part 30 may be used as long as the electronic part 30 is a circuit part or a circuit element which is used in the electronics packaging field. Examples of the type of such an electronic part 30 include an IC (for example, a control IC), an inductor, a semiconductor device (for example, a metal oxide semiconductor (MOS)), a capacitor, a power device, a light-emitting device (for example, an LED), a chip resistor, a chip capacitor, a chip varistor, a chip thermistor, other chip-shaped stacked filters, and a connection terminal. In the electronic part package, the number of electronic parts 30 is not limited to one and two or more electronic parts 30 may be provided. In such a case, the plurality of electronic parts 30 may be the same in type or may be different types of electronic parts.

The dummy member 36 contributes to the formation of an irregular surface of the sealing resin layer later. That is, the dummy member 36 is interposed between the sealing resin layer 40 and the adhesive carrier 20 in the process (ii). Thereafter, by separating and removing the adhesive carrier 20 and removing the dummy member 36 in the process (iii), a projection and depression portion can be formed on a principal surface of the sealing resin layer 40 (that is, a sealing resin layer principal surface at which the electrode of the electronic part 30 is to be exposed).

The "dummy member" in this embodiment means a member that is used in the formation of, in particular, a package precursor in the production of an electronic part package but does not become a component element of the final electronic part package. That is, the "dummy member" is a member that can be regarded as being similar to the component element of the package precursor in the production stage of the electronic part package but is eventually removed.

The shape, size, and placement mode of the dummy member 36 directly relate to the form of the irregular surface of the sealing resin layer 40. That is, the height H and the width W of the dummy member 36, the pitch P when a plurality of dummy members 36 are placed, and so forth are directly reflected in the form of the irregular surface of the sealing resin layer 40. Since the depression depth D' (FIG. 2E) of the irregular surface is determined by the height H (FIG. 2B) of the dummy member 36, the depression depth D' of the irregular surface becomes substantially identical to the height H of the dummy member 36. Likewise, since the depression width W' (FIG. 2E) of the irregular surface is determined by the width W (FIG. 2B) of the dummy member 36, the depression width W' of the irregular surface becomes substantially identical to the width W of the dummy member 36. Likewise, since the depression pitch P' (FIG. 2E) of the irregular surface is determined by the pitch P (FIG. 2B) of the plurality of dummy members 36, the depression pitch P' of the irregular surface becomes substantially identical to the pitch P of the dummy members 36.

The following are merely examples. The height H (FIG. 2B) of the dummy member 36 is desirably about 1 to 1000 μm, more desirably about 10 to 100 μm, and about 50 μm, for example. The width W (FIG. 2B) of the dummy member 36 is desirably about 1 to 1000 μm, more desirably about 10 to 100 μm, and about 50 μm, for example. Moreover, the pitch P (FIG. 2B) of the plurality of dummy members 36 is desirably about 2 to 2000 μm and more desirably about 20 to 200 μm.

The overall shape of the dummy member 36 is not limited to a particular shape. However, it is desirable that the lower side face 36a of the dummy member 36 has a planar shape. On the other hand, the shape of the upper side face 36b of the dummy member 36 is not limited to a particular shape and may be formed as a curved face, for example. Moreover, the dummy member 36 may have a size of extension similar to the size of extension of a metal layer to be formed (in the mode depicted in the drawing, the size of a metal layer extending in the direction of the front and the back on the plane of paper) or may have a size of extension which is smaller than the size of extension of the metal layer to be formed.

The material of the dummy member 36 is not limited to a particular material and may be, for example, any or all of resin, metal, and ceramic. For example, when the dummy member 36 is removed by dissolving the dummy member 36 with a chemical solution after the separation and removal of the adhesive carrier 20, it is desirable that the material of the dummy member 36 has the property of being able to be dissolved in a chemical solution. Moreover, when the dummy member 36 is removed integrally with the adhesive carrier 20 at the time of the separation and removal of the adhesive carrier 20, it is desirable that the material of the dummy member 36 has the property of being able to be separated from the sealing resin layer 40.

The adhesive carrier 20 may be a carrier sheet formed of a substrate and an adhesive layer, for example. That is, as depicted in FIG. 2A, a carrier sheet with a two-layer structure in which an adhesive layer 26 is provided on a supporting base material 24 may be used. It is desirable that the supporting base material 24 has flexibility. This makes it possible to separate and remove the adhesive carrier 20 easily from the sealing resin layer 40 in the subsequent step.

As the supporting base material 24, any sheet-like member may be used as long as the sheet-like member does not interfere with the processes which are performed later, such as "the placement of an electronic part and a dummy member" and "the formation of a sealing resin layer". For example, the material of the supporting base material 24 may be any or all of resin, metal, and ceramic. Examples of the resin used as the material of the supporting base material 24 include polyester resins such as polyethylene terephthalate and polyethylene naphthalate, acrylic resins such as polymethyl methacrylate, a polycycloolefin resin, and polycarbonate. Examples of the metal used as the material of the supporting base material 24 include iron, copper, aluminum, and an alloy thereof (for example, the metal may be a stainless material such as SUS). Examples of the ceramic used as the material of the supporting base material 24 include apatite, alumina, silica, silicon carbide, silicon nitride, and boron carbide. Since the supporting base material 24 has a "sheet-like shape", the thickness of the supporting base material 24 itself is desirably 0.1 to 2.0 mm and more desirably 0.2 to 1.0 mm (for example, 0.2 mm).

On the other hand, the adhesive layer 26 is not limited to a particular adhesive layer as long as the adhesive layer 26 has the property of being able to adhere to the electronic part 30. For example, the adhesive layer 26 itself may be a layer containing at least one or more adhesive materials selected from a group consisting of an acrylic resin adhesive, a polyurethane resin adhesive, a silicone resin gluing agent, and an epoxy resin adhesive. The thickness of the adhesive layer 26 is desirably 2 to 50 μm and more desirably 5 to 20 μm (for example, 10 μm). As the adhesive layer 26, an adhesive double-faced tape may be used (for example, a tape formed of a resin thin layer, such as a PET film, with principal surfaces to which adhesive layers are formed may be used).

After the electronic part 30 and the dummy member 36 are placed on the adhesive carrier 20, as depicted in FIG. 2C, the sealing resin layer 40 is formed in such a way as to cover the electronic part 30 and the dummy member 36, whereby a sealed body is obtained. A sealing resin layer precursor is formed by applying a resin raw material to the adhesive carrier 20 by spin coating, the doctor blade method, or the like. Thereafter, by subjecting such a sealing resin layer precursor to heat curing or light curing, whereby it is possible to form the sealing resin layer 40. Moreover, in addition to the application of a resin raw material, in another method, also by providing a sealing resin layer precursor by bonding a half-cured or uncured resin film or the like to an adhesive face of the adhesive carrier 20 and then subjecting the resin film to heat curing or light curing, it is possible to form the sealing resin layer 40. The specific type of resin raw material and resin film raw material may be any type as long as the resin raw material and the resin film raw material have insulating properties and may be an epoxy resin or a silicone resin, for example. Moreover, as a material having flexibility, resins having high flexibility such as polyurethane rubber and a polyurethane elastomer may be used.

After the sealing resin layer formation, as depicted in FIGS. 2C to 2E, the adhesive carrier 20 is separated and removed from the sealing resin layer 40 and the dummy member 36 is removed. As a result, it is possible to make the electrode 35 of the electronic part 30 exposed at a principal surface 45 of the sealing resin layer 40 in a flush state and an irregular surface 45a is formed on the principal surface 45 of the sealing resin layer 40 at which the electrode 35 is exposed. As is clear from the mode depicted in the drawing, the irregular surface 45a is formed due to the presence of the dummy member 36, and the outline of the irregular surface 45a directly reflects the shape of the dummy member 36. In other words, the "irregular surface" in the present disclosure has a form in which the irregular surface is recessed toward the inside of the sealing resin layer 40 in such a way that the outline of the dummy member 36 is reflected therein. That is, as the irregular surface 45a, a face in which the principal surface 45 of the sealing resin layer 40 is locally recessed toward the inside to a level lower than an exposed surface level of the electrode 35 is formed.

In a package precursor 100', the electrode of the electronic part is exposed at the principal surface 45 of the sealing resin layer 40, and an irregular surface 45a is formed on the principal surface 45. Thereafter, metal plating processing is performed. Specifically, as depicted in FIG. 2F, metal plating processing is performed all over the principal surface 45 at which an electrode surface of the electronic part 30 is exposed, the principal surface 45 on which the irregular surface 45a is formed. Thereby, a metal plated layer 50 is formed. Desirably, a dry-plated layer 51 is formed by performing a dry plating method all over the principal surface 45 of the sealing resin layer 40, and, then, a wet-plated layer 52 is formed by performing a wet-plating method all over a principal surface of the dry-plated layer 51. By so doing, the metal plated layer 50 with a two-layer configuration provided with the dry-plated layer 51 and the wet-plated layer 52 is formed. Such a plating process has the following process feature: "directly forming a metal layer on the electrode exposed surface of the electronic part 30". As described above, it is possible to provide the thick wet-plated layer 52. In particular, in the present disclosure, by direct formation, such a thick metal plated layer is joined to the electrode 35 exposed from the sealing resin layer 40 and is provided on the irregular surface 45a.

The dry plating method includes vacuum plating (PVD) and chemical-vapor deposition (CVD). The vacuum plating (PVD) further includes sputtering, vacuum deposition, ion plating, and so forth. On the other hand, the wet-plating method includes electroplating (for example, electrolytic plating), chemical plating, hot-dip plating, and so forth. As a desired mode, in the production method of the present disclosure, sputtering is performed as the dry plating method and electroplating (for example, electrolytic plating) is performed as the wet-plating method.

Desirably, the dry-plated layer 51 having a thickness of 100 to 1000 nm is formed by performing the dry plating method, and then the wet-plated layer 52 having a thickness of 18 to 500 μm is formed by performing the wet-plating method (see an enlarged view on the right of FIG. 2F). That is, while the dry-plated layer 51 is extremely thin, the thick wet-plated layer 52 is provided on the dry-plated layer 51. Since such a thick wet-plated layer 52 is provided, it is possible to thicken the metal plated layer 50 as a whole.

It is desirable that the dry-plated layer 51 formed by the dry plating method contains at least one type of metal material selected from a group consisting of titanium (Ti), chromium (Cr), and nickel (Ni), for example. Moreover, the material of the dry-plated layer 51 may be a material containing at least one type of material selected from a group consisting of other metal materials such as silver (Ag), aluminum (Al), an Al alloy, a gold (Au), platinum (Pt), tin (Sn), copper (Cu), and tungsten (W). On the other hand, it is desirable that the wet-plated layer 52 formed by the wet-plating method contains at least one type of metal material selected from a group consisting of copper (Cu) and aluminum (Al). Furthermore, the material of the wet-plated layer 52 may be a material containing at least one type of material selected from a group consisting of other metal materials such as silver (Ag), palladium (Pd), platinum (Pt), and nickel (Ni).

After the metal plated layer 50 formed of the dry-plated layer 51 and the wet-plated layer 52 is obtained, it is desirable to perform patterning processing on such a metal plated layer 50. That is, as depicted in FIGS. 2F and 2G, it is desirable to perform patterning processing on the metal plated layer 50 formed on the principal surface 45 of the sealing resin layer 40 (more specifically, "the principal surface at which the electrode surface of the electronic part is exposed, the principal surface on which projections and depressions are provided"). In other words, it is desirable to form a metal plating pattern layer 50A (a metal plating pattern layer circuit A) that is joined to the electrode surface of the electronic part 30 and is positioned on the sealing resin layer irregular surface by performing patterning processing on such a metal plated layer 50.

The patterning processing can be performed through the formation of a resist having a predetermined pattern. Such patterning processing itself is not limited to particular patterning processing as long as the patterning processing is processing which is used in the electronics packaging field. For example, intended patterning processing may be performed by using photolithography in which the formation of a resist, exposure and development, etching, and so forth are performed. Specifically, after a resist is first formed all over the metal plated layer, patterning is performed on the resist such that the resist has a predetermined pattern shape. Then, by locally removing the metal plated layer by performing etching or the like via such a resist having a predetermined pattern, it is possible to form the metal plating pattern layer 50A. The resist is eventually separated and removed.

Figure 3A:
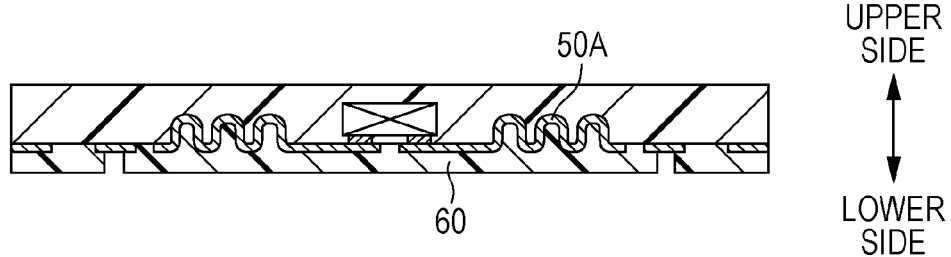
FIGS. 3A to 3C are process sectional views schematically depicting the method for producing an electronic part package of the present disclosure according to the first embodiment.
Figure 3B:
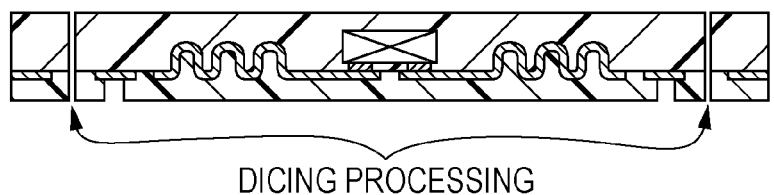

After the metal plating pattern layer 50A is obtained, it is desirable to form a resist layer on such a metal plating pattern layer 50A. For example, as depicted in FIG. 3A, it is desirable to form a solder resist layer 60 on the surface of the sealing resin layer 40 in such a way as to cover partly the metal plating pattern layer 50A. The formation of such a resist layer 60 may be similar to the formation of a solder resist which is commonly used in the electronics packaging field.

Figure 3C:
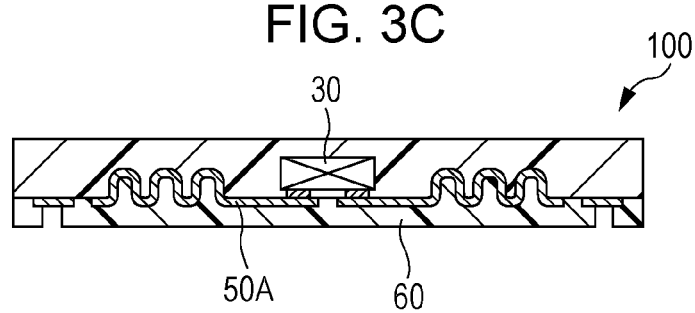

Through the above-described processes (and also through additional dicing processing depicted in FIG. 3B, for example), an electronic part package 100 depicted in FIG. 3C can be eventually obtained.

Here, the "metal plated layer/metal plating pattern layer" which is the distinctive element of the present disclosure will be described in detail. In the present disclosure, the irregular surface is formed on the resin layer principal surface due to the presence of the resin layer internal object such as the dummy member, whereby the "metal plated layer/metal plating pattern layer" having projections and depressions is eventually obtained. In other words, the "metal plated layer/metal plating pattern layer" is formed in such a way that part of the resin layer principal surface (in particular, "the resin layer principal surface lying in the same plane as the electrode of the electronic part") is positioned at a different level by the resin layer internal object such as the dummy member and a step portion is provided in the part of the resin layer principal surface positioned at the different level. More specifically, when the "metal plated layer/metal plating pattern layer" is formed in such a way as to have the same thickness on the resin layer principal surface lying in the same plane as the electrode of the electronic part, the "metal plated layer/metal plating pattern layer" has a step portion in a resin layer principal surface portion positioned at the different level. The form of the step portion of the "metal plated layer/metal plating pattern layer" can reflect the form of the dummy member, and, for example, the size of the step portion can correspond to the thickness of the dummy member.

The production method of the present disclosure can be implemented in various specific embodiments. Hereinafter, these embodiments will be described.

(Second Embodiment)

Principal manufacturing method processes of the present disclosure according to a second embodiment are depicted in FIGS. 4A to 4F. The feature of the second embodiment is that part of the package precursor formation process is different from the package precursor formation process of the first embodiment. In particular, the form of a carrier which is used in the formation of a package precursor is different from the form of the carrier of the first embodiment.

The formation of a package precursor according to the second embodiment includes (i)' a process of placing, by using an adhesive protruding carrier as a carrier, an electronic part on the protruding carrier in such a way that the electronic part is attached to the adhesive protruding carrier, (ii)' a process of forming a sealing resin layer on the protruding carrier in such a way as to cover the electronic part, and (iii)' a process of making an electrode of the electronic part exposed at a principal surface of the sealing resin layer by separating and removing the protruding carrier from the sealing resin layer and forming an irregular surface on the principal surface of the sealing resin layer at which the electrode is exposed.

Figure 4A:
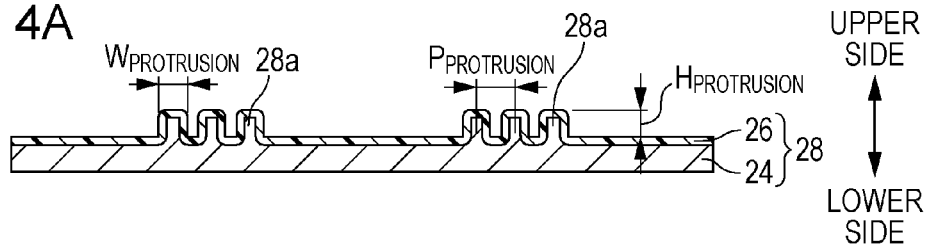
FIGS. 4A to 4F are process sectional views schematically depicting the method for producing an electronic part package of the present disclosure according to a second embodiment.

A more specific description will be given below by using the drawings. As depicted in FIG. 4A, in the second embodiment, an adhesive protruding carrier 28 is used. Such a protruding carrier 28 is a carrier provided with a plurality of projections 28a. For example, in the case of a carrier sheet with a two-layer structure in which an adhesive layer 26 is provided on a supporting base material 24, a principal surface of the supporting base material 24 has a form in which the principal surface has a plurality of protrusions. The adhesive layer 26 is provided along the outline of the protrusions of the supporting base material 24.

As is clear from the mode depicted in the drawing, the protruding carrier 28 can be regarded as a carrier obtained as a result of the dummy member 36 and the adhesive carrier 20 in the first embodiment being integrated with each other. Therefore, the height $H_{protrusion}$, the width $W_{protrusion}$, and the pitch $P_{protrusion}$, and so forth of the projections 28a depicted in FIG. 4A can correspond to the height H, the width W, and the pitch P of the dummy members 36.

Figure 4B:
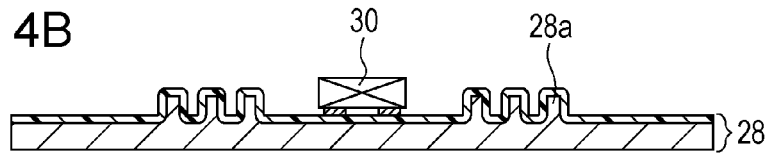
Figure 4C:
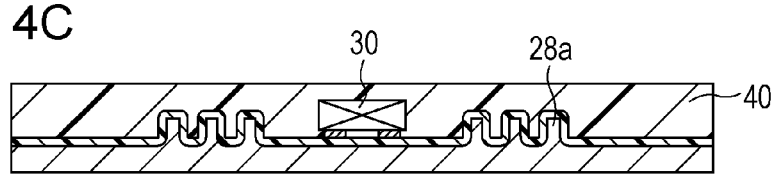
Figure 4D:
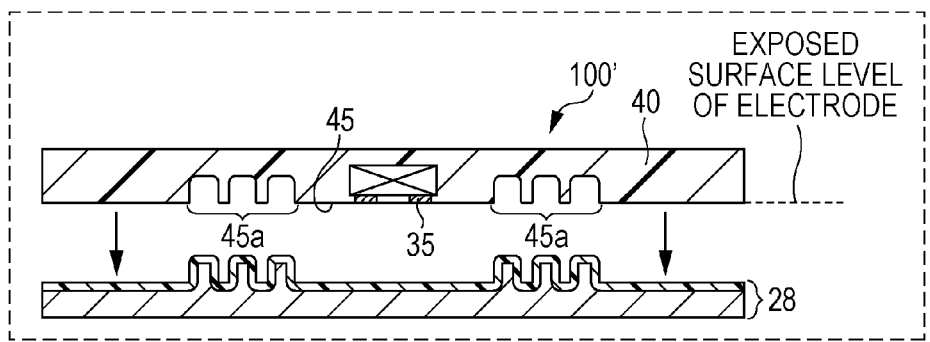
Figure 4E:
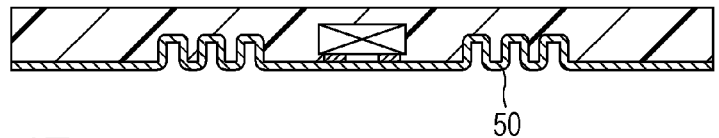
Figure 4F:
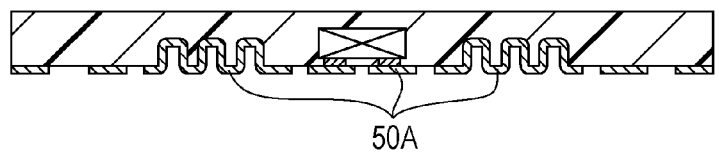

An electronic part 30 is placed on such a protruding carrier 28. As depicted in FIG. 4B, the electronic part 30 is placed in a carrier region other than a region in which the projections 28a are placed. That is, as is the case with the first embodiment, at least one type of electronic part 30 is mounted on the adhesive protruding carrier 28. Next, as depicted in FIG. 4C, a sealing resin layer 40 is formed on the protruding carrier 28 in such a way as to cover the electronic part 30. More specifically, the sealing resin layer 40 is formed in such a way as to cover the electronic part 30 and the projections 28a. Then, after the sealing resin layer formation, the protruding carrier 28 is separated from "the sealing resin layer 40 in which the electronic part 30 is buried" as depicted in FIG. 4D. As a result, it is possible to make an electrode 35 of the electronic part 30 exposed at a principal surface 45 of the sealing resin layer 40 and an irregular surface 45a is formed on the principal surface 45 of the sealing resin layer 40 at which the electrode 35 is exposed.

As is clear from the mode depicted in the drawing, since the irregular surface 45a is formed due to the presence of the projections 28a of the protruding carrier 28, the outline of the irregular surface 45a directly reflects the shapes of the projections 28a. In particular, the "irregular surface 45a" has a form in which the irregular surface 45a is recessed to the inside of the sealing resin layer 40 in such a way that the outline of the projections 28a is reflected therein. That is, as is the case with the first embodiment, as the irregular surface 45a, "a face in which the principal surface of the sealing resin layer is locally recessed toward the inside to a level lower than an exposed surface level of the electrode" is formed.

As the processes after the package precursor 100' is obtained, processing similar to the processing in the above-described first embodiment is performed (for example, FIGS. 4E and 4F and FIGS. 3A to 3C), whereby a final electronic part package can be obtained.

(Third Embodiment)

Principal manufacturing method processes of the present disclosure according to a third embodiment are depicted in FIGS. 5A to 5G. The feature of the third embodiment is that part of the package precursor formation process is different from the package precursor formation process of the first embodiment. In particular, the specific form of a dummy member is different from the form of the dummy member of the first embodiment.

In the third embodiment, the dummy member 36 whose surface is roughened is used when the package precursor 100' is formed. More specifically, a dummy member 36 whose upper side face 36b is roughened is used. The degree of roughness of the upper side face 36b may be set such that, for example, arithmetic mean roughness Rz is 5.0 μm or more and more desirably 7.0 μm or more. There is no particular limit to the upper limit of the arithmetic mean roughness Rz. The upper limit is 10.0 μm or less, for example. The "arithmetic mean roughness Rz" here refers to roughness "Rz" defined in JIS B0601.

Figure 5A:
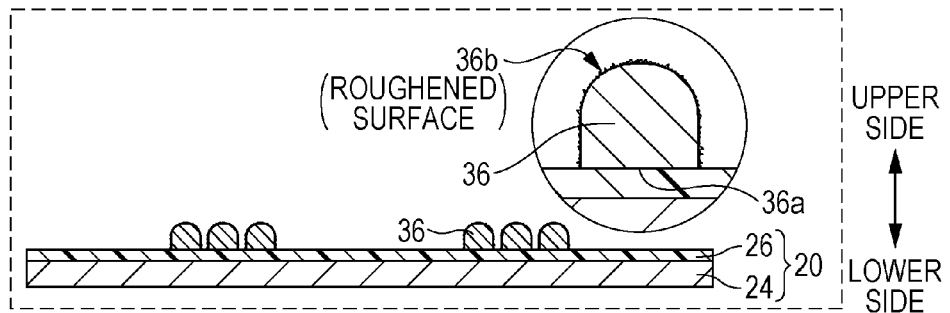
FIGS. 5A to 5G are process sectional views schematically depicting the method for producing an electronic part package of the present disclosure according to a third embodiment.
Figure 5B:
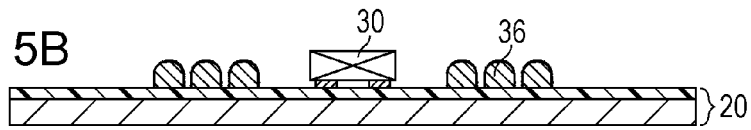
Figure 5C:
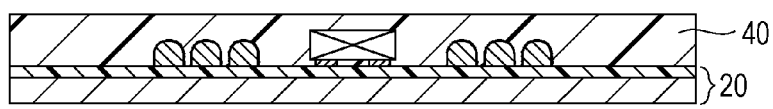
Figure 5D:
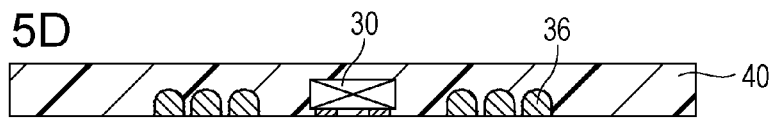
Figure 5E:
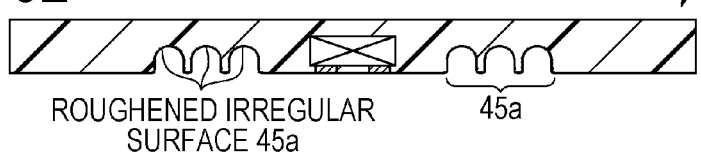
Figure 5F:
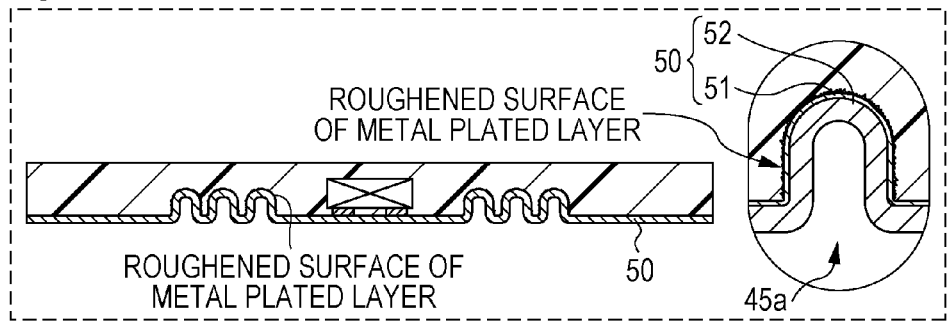
Figure 5G:
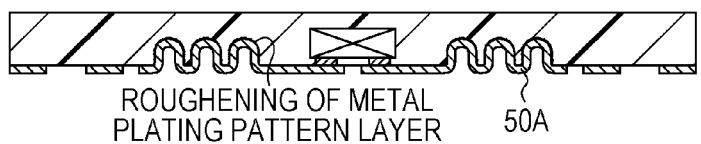

When a package precursor is fabricated by using the dummy member 36 with the roughened surface (FIGS. 5A to 5E), an irregular surface 45a which is formed on a principal surface 45 of a sealing resin layer 40 at which an electrode 35 is exposed is roughened. That is, as depicted in FIG. 5E, the surface of the irregular surface 45a can microscopically form a roughened surface. Therefore, when a metal plated layer 50 is then formed on the irregular surface 45a, an irregular surface of the metal plated layer 50 similarly has a roughened surface microscopically (FIG. 5F). Specifically, as depicted in a partially enlarged view on the right of FIG. 5F, an upper side face of the metal plated layer 50 formed in a region of the irregular surface 45a (that is, "a face of the metal plated layer making contact with the sealing resin layer") can become a roughened surface.

When the roughened surface is formed in this manner, it is possible to obtain further improved heat dissipation characteristics. Specifically, since the surface area of the metal plated layer (and the metal plating pattern layer obtained therefrom) is further increased due to not only "the projections and depressions" but also "the roughened surface", it is possible to achieve further improved heat dissipation characteristics.

(Fourth Embodiment)

Principal manufacturing method processes of the present disclosure according to a fourth embodiment are depicted in FIGS. 6A to 6G. The feature of the fourth embodiment is that the mode of formation of a metal plated layer is different from the mode of formation of the first embodiment.

Figure 6A:
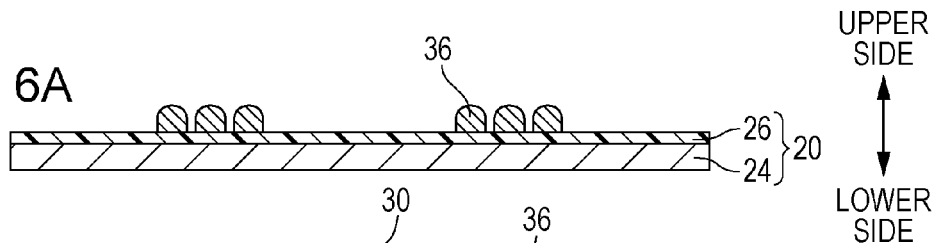
FIGS. 6A to 6G are process sectional views schematically depicting the method for producing an electronic part package of the present disclosure according to a fourth embodiment.
Figure 6B:
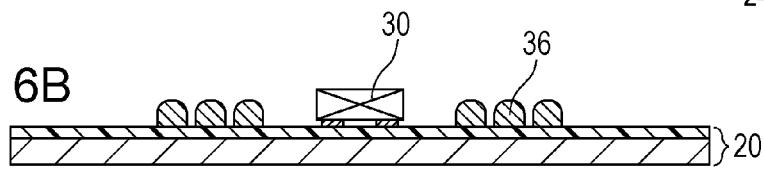
Figure 6C:
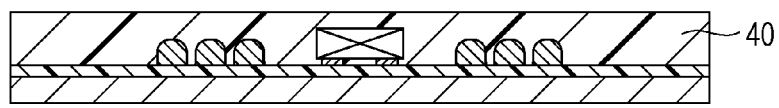
Figure 6D:
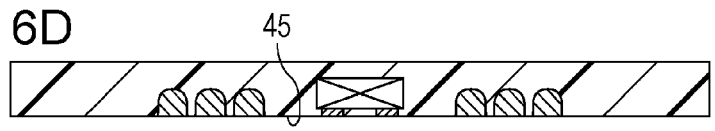
Figure 6E:
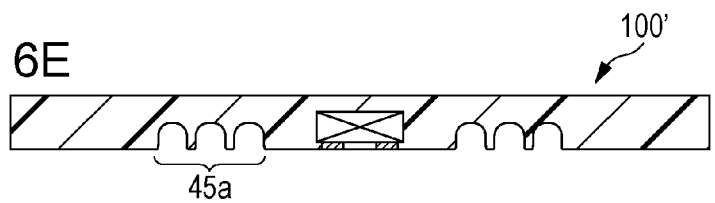
Figure 6F:
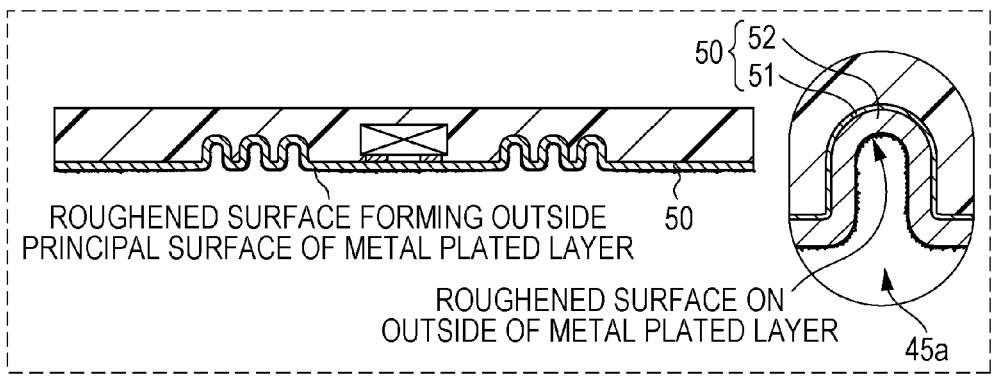
Figure 6G:
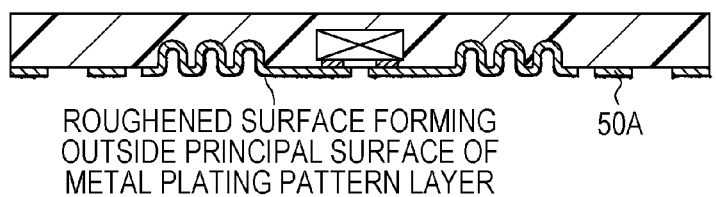

Specifically, as depicted in FIG. 6F, an exposed surface of a metal plated layer 50 is roughened. More specifically, the metal plated layer 50 has two principal surfaces opposite to each other, and the outer principal surface of the principal surfaces is roughened. This makes it possible to obtain the same effect as the third embodiment. The degree of roughness of the roughened surface forming the outer principal surface of the metal plated layer 50 may be set such that, for example, arithmetic mean roughness Rz is 5.0 μm or more and more desirably 7.0 μm or more. There is no particular limit to the upper limit of the arithmetic mean roughness Rz. The upper limit is 10.0 μm or less, for example. That is, in the fourth embodiment, since the surface area of an exposed surface of the metal plated layer (and the metal plating pattern layer obtained therefrom) is further increased due to not only "the projections and depressions" but also "the roughened surface", it is possible to achieve further improved heat dissipation characteristics.

[Electronic Part Package of the Present Disclosure]

Next, the electronic part package of the present disclosure will be described. The electronic part package of the present disclosure is a package obtained by the above-described production method of the present disclosure.

As depicted in FIG. 7, an electronic part package 100 of the present disclosure includes an electronic part 30, a sealing resin layer 40, and a metal plating pattern layer 50A. The electronic part 30 is buried in the sealing resin layer 40, and the metal plating pattern layer 50A is provided on the sealing resin layer 40.

An electrode 35 of the electronic part 30 buried in the sealing resin layer 40 is exposed from the sealing resin layer 40 in a flush state. That is, a principal surface of the electrode 35 is exposed from a flat region in such a way as to be located in the same plane as the flat region of a principal surface 45 of the sealing resin layer 40. Moreover, the principal surface 45 of the sealing resin layer 40 at which the electrode 35 is exposed has an irregular surface 45a. That is, the principal surface 45 of the sealing resin layer 40 includes the flat region and the region of the irregular surface 45a. The metal plating pattern layer 50A is joined to the electrode 35 of the electronic part 30 and extends so as to reach an area on the irregular surface 45a of the sealing resin layer 40. Moreover, the metal plating pattern layer 50A has a laminated structure and is formed of a dry-plated layer 51A which is positioned relatively inside and a wet-plated layer 52A which is positioned relatively outside.

A term "exposed" which is used in connection with the electronic part package practically means that an electrode surface of the electronic part is positioned at the same level as the sealing resin layer surface or at a level outside the sealing resin layer surface. In other words, the term "exposed" which is used in connection with the electronic part package means that the electrode surface of the electronic part can be visually observed from the outside when the metal plating pattern layer 50A and the like are removed from the electronic part package.

Each of the component elements of the electronic part package 100 of the present disclosure will be described in detail. The sealing resin layer 40 is a resin layer having insulating properties. The resin material thereof is not limited to a particular material as long as the material possesses the insulating properties. The following is a merely example. The sealing resin layer 40 may be a layer containing an epoxy resin, a silicone resin, or the like. The thickness of such a sealing resin layer 40 is desirably about 0.5 to 5.0 mm and more desirably about 1.2 to 1.8 mm.

Examples of the electronic part 30 buried in the sealing resin layer 40 include an IC (for example, a control IC), an inductor, a semiconductor device (for example, a metal oxide semiconductor (MOS)), a capacitor, a power device, a light-emitting device (for example, an LED), a chip resistor, a chip capacitor, a chip varistor, a chip thermistor, other chip-shaped stacked filters, and a connection terminal.

In the electronic part package of the present disclosure, as depicted in FIG. 7, the metal plating pattern layer 50A has a laminated structure formed of "the wet-plated layer 52A which is positioned relatively outside" and "the dry-plated layer 51A which is positioned relatively inside". In such a metal plating pattern layer 50A having the laminated structure, the dry-plated layer (51A) is provided in such a way as to be directly joined to the electronic part 30 (in particular, the electrode 35 thereof) and the wet-plated layer (52A) is provided on the dry-plated layer. As is clear from those described above, the expression "positioned relatively outside" in the present disclosure practically means that something is located in a place farther away from "the principal surface 45 of the sealing resin layer" and the expression "positioned relatively inside" practically means that something is located in a place closer to "the principal surface 45 of the sealing resin layer".

In the electronic part package of the present disclosure, the dry-plated layer 51A is formed by the dry plating method and therefore it is desirable that the dry-plated layer 51A contains at least one type of metal material selected from a group consisting of titanium (Ti), chromium (Cr), and nickel (Ni). Moreover, the material of the dry-plated layer 51A may be a material containing at least one type of material selected from a group consisting of other metal materials such as silver (Ag), aluminum (Al), an Al alloy, gold (Au), platinum (Pt), tin (Sn), copper (Cu), and tungsten (W). The dry-plated layer 51A is not limited to a one-layer structure and may be formed of a multilayer structure (for example, a two-layer structure) when necessary.

Moreover, since the dry-plated layer 51A itself can also function as a stress relaxation layer in the metal plating pattern layer 50A, the connection reliability of the package of the present disclosure can be improved also in that respect. On the other hand, the wet-plated layer 52A is formed by the wet-plating method and therefore it is desirable that the wet-plated layer 52A contains at least one type of metal material selected from a group consisting of copper (Cu) and aluminum (Al). Moreover, the material of the wet-plated layer 52A may be a material containing at least one type of material selected from a group consisting of other metal materials such as silver (Ag), palladium (Pd), platinum (Pt), and nickel (Ni). However, if great importance is attached to "heat dissipation characteristics", it is desirable that the material of the wet-plated layer 52A is a material that has high thermal conductivity and effectively contributes to heat dissipation characteristics and therefore copper (Cu) is especially desirable.

While the dry-plated layer 51A is extremely thin (desirably the dry-plated layer 51A may have a thickness of the order of nanometer), the wet-plated layer 52A is thick (desirably the wet-plated layer 52A may have a thickness of the order of micron) and a large portion of the metal plating pattern layer 50A is made up of the wet-plated layer 52A. For instance, while the thickness of the dry-plated layer 51A is desirably 100 to 1000 nm (for example, the thickness of a 300-nm-thick Ti layer and 1000-nm-thick Cu layer), the thickness of the wet-plated layer 52A is desirably about 18 to 500 82 m, more desirably about 18 to 250 µm, and even more desirably about 18 to 125 µm. As described above, in the present disclosure, since the wet-plated layer 52A is thick, the thick metal plating pattern layer 50A is implemented.

As is clear from the mode depicted in FIG. 7, in the electronic part package 100 of the present disclosure, there is direct surface contact (in particular, "direct joint" or "surface joint") between the metal plating pattern layer 50A and the electronic part 30 (in particular, the electrode 35 thereof), whereby the metal plating pattern layer 50A and the electronic part 30 (in particular, the electrode 35 thereof) are electrically connected to each other.

Here, in the present disclosure, since the dry-plated layer 51A of the metal plating pattern layer 50A is extremely thin (for example, since the dry-plated layer 51A of the metal plating pattern layer 50A is so thin that thermal resistance and electrical resistance can be virtually ignored), the thick wet-plated layer 52A of the metal plating pattern layer 50A can be regarded as coming into direct surface contact (direct joint or surface joint) with the electronic part 30 (in particular, the electrode portion 35 thereof). The "surface contact (direct joint or surface joint)" here practically means a mode in which the principal surfaces of the elements make contact with each other, in particular, a mode in which the principal surfaces (upper side face and lower side face) of the elements entirely make contact with each other in an area in which the principal surfaces overlap one another. Specifically, the "surface contact (direct joint or surface joint)" here practically means a mode in which "the principal surface (the lower principal surface exposed from the sealing resin layer) of the electronic part (in particular, the electrode portion thereof)" and "the principal surface (the upper principal surface) of the metal plating pattern layer 50A" entirely make contact with each other in an area in which "the principal surface of the electronic part" and "the principal surface of the metal plating pattern layer 50A" overlap one another. In other words, the "surface contact (direct joint or surface joint)" used in this specification means a mode in which the principal surfaces of the metal plating pattern layer and the electronic part (in particular, the electrode portion thereof) entirely make contact with each other.

By using a thick metal plating pattern layer formed by way of such "direct joint or surface joint", it is possible to release the heat from the electronic part efficiently to the outside. That is, the metal plating pattern layer 50A can be made to function as a heat sink or a heat radiating member. In particular, in the present disclosure, the metal plating pattern layer 50A joined to the electronic part 30 (in particular, the electrode portion 35 thereof) is positioned on the irregular surface 45a of the sealing resin layer 40. That is, the metal plating pattern layer 50A formed on the sealing resin layer principal surface is joined to the electrode 35 of the electronic part 30, the electrode 35 exposed from the sealing resin layer 40, and extends on the irregular surface 45a formed on the principal surface 45 of the sealing resin layer 40. As depicted in FIG. 7, since the metal plating pattern layer 50A provided on the irregular surface 45a of the sealing resin layer 40 may have projections and depressions, the surface area of the metal plating pattern layer 50A is increased, which makes it possible to achieve further improved heat dissipation characteristics.

As described above, the electronic part package 100 of the present disclosure may have improved heat dissipation characteristics not only by the thick metal plating pattern layer 50A but also by the effect of an increase in the surface area caused by the projections and depressions of the thick metal plating pattern layer 50A.

As for the projections and depressions of the metal plating pattern layer 50A, as depicted in the drawing, the irregular surface 45a of the sealing resin layer 40 has desirably a form in which the irregular surface 45a is locally recessed toward the inside to a level lower than an exposed surface level of the electrode 35 (that is, a form in which part of the principal surface of the sealing resin layer is recessed toward the inside to a level lower than the exposed surface level). In addition, the metal plating pattern layer 50A is formed along the outline of the irregular surface 45a on the irregular surface 45a of the sealing resin layer 40. In this respect, it is desirable that such a metal plating pattern layer 50A has a meander shape following the outline of the irregular surface 45a. Although such a metal plating pattern layer 50A having a meander structure is not particularly bulky, the effect of an increase in the surface area of the metal plated layer (the effect of an increase in the surface area per unit area of the package) is great and therefore the metal plating pattern layer 50A contributes also to implementation of a reduction in size of the package while improving the heat dissipation characteristics of the electronic part package 100.

The irregular surface 45a of the sealing resin layer 40 has a bellows-like shape having alternate ridges and valleys extending in a direction perpendicular to the cross section depicted in FIG. 7, for example. In this case, the metal plating pattern layer 50A also has a bellows-like shape having alternate ridges and valleys extending in a direction perpendicular to the cross section depicted in FIG. 7 along the outline of the irregular surface 45a.

The metal plating pattern layer 50A may be a layer covering the whole of the irregular surface 45a of the sealing resin layer 40 or may be a layer covering part thereof. Therefore, the area of the bellows-like shape of the metal plating pattern layer 50A may substantially coincide with the area of the bellows-like shape of the sealing resin layer 40 or may be smaller than the area of the bellows-like shape of the sealing resin layer 40. For example, the width (that is, the length in a direction perpendicular to the cross section depicted in FIG. 7) of the bellows-like shape of the metal plating pattern layer 50A may be narrower than the width (that is, the length in a direction perpendicular to the cross section depicted in FIG. 7) of the bellows-like shape of the sealing resin layer 40. Moreover, the width of the bellows-like shape of the metal plating pattern layer 50A and the width of the bellows-like shape of the sealing resin layer 40 may be fixed or may vary depending on the position (that is, a plurality of ridges may have different lengths). Furthermore, the ridges of the bellows-like shape of the sealing resin layer 40 and the ridges of the bellows-like shape of the metal plating pattern layer 50A may have a shape extending straight in a direction perpendicular to the cross section depicted in FIG. 7 or may have a curved shape.

The metal plating pattern layer 50A is integrally provided on the region of the irregular surface 45a and the flat region of the principal surface of the sealing resin layer 40 and on the principal surface of the electrode 35 of the electronic part 30. A portion of the metal plating pattern layer 50A other than an area on the irregular surface 45a is located in the same plane so as to face the flat region of the sealing resin layer 40 and the principal surface of the electrode 35.

Since the package of the present disclosure may have excellent heat dissipation characteristics, it is possible to produce the effect of improving the characteristics of the electronic part and increasing the operating life of the electronic part and prevent effectively "denaturation and discoloration of the electronic part and the sealing resin" and so forth caused by heat. Moreover, thanks to "surface contact (that is, direct joint or surface joint)", the package of the present disclosure has great electrical resistance as compared to a case in which electrical connection is performed via a wire or a bump. Therefore, with the package of the present disclosure, it is also possible to produce the effect of, for example, being capable of passing a higher current. For example, in the case of a light-emitting device package such as an LED package, the present disclosure can implement a higher-intensity light-emitting device package by improved heat dissipation characteristics, a high current, and so forth.

When a light-emitting device is used as the electronic part 30, it is desirable that the sealing resin layer 40 is a layer formed of a transparent resin. That is, it is desirable that a transparent resin layer is provided as the sealing resin layer 40. As the material and the thickness of the transparent resin layer, the material and the thickness which are usually used in a common LED package may be adopted. Here, "the light-emitting device" is an element that emits light and practically means, for example, a light-emitting diode (LED) and an electronic part including the light-emitting diode (LED). Therefore, "the light-emitting device" in the present disclosure is used as a term for a mode including not only "an LED bare chip (that is, an LED chip)" but also "a discrete type with a molded LED chip". The example is not limited to an LED chip, and a semiconductor laser chip, for example, can also be used.

In the case of a package including a light-emitting device in the electronic part 30, it is possible to use the dry-plated layer 51A of the metal plating pattern layer 50A as a "reflecting layer". In such a case, since a "reflecting layer" is positioned immediately below the light-emitting device, it is possible to reflect efficiently the downward light emitted from the light-emitting device by the reflecting layer (that is, the dry-plated layer 51A of the metal plating pattern layer 50A). That is, it is possible to direct "the light emitted downward" upward. In order to obtain such a high reflection property, it is desirable that the dry-plated layer 51A of the metal plating pattern layer 50A contains a metal selected from a group consisting of silver (Ag), aluminum (Al), and so forth. The electronic part package of the present disclosure is also excellent in terms of extraction of light from an upper surface of the sealing resin layer 40. Specifically, in the electronic part package of the present disclosure, it is possible to diffuse the light from the light-emitting device efficiently upward by the irregular surface of the sealing resin layer 40, that is, the metal plating pattern layer 50A having projections and depressions and improve the efficiency of extracting light from the upper surface (the light extraction surface) of the sealing resin layer 40.

In the present disclosure, a package product provided with a resist layer is more desirable as a package product. That is, a resist layer may be provided on the metal plating pattern layer 50A. For example, as depicted in FIG. 3C, the solder resist layer 60 may be provided in such a way as to cover at least part of the metal plating pattern layer 50A. Such a resist layer 60 may be similar to a solder resist which is commonly used in the electronics packaging field.

Such an electronic part package 100 according to the aspect of the present disclosure can be implemented in various modes. The electronic part package 100 depicted in FIG. 7 can correspond to "the electronic part package obtained by the production method of the first or second embodiment", and a mode of a package obtained by the production method of the third and fourth embodiments has the following features.

(Electronic Part Package Obtained by the Production Method of the Third and Fourth Embodiments)

In the electronic part package 100 obtained by the production method of the third embodiment, the irregular surface 45a of the sealing resin layer principal surface at which the electrode 35 is exposed forms a roughened surface. That is, the surface of the irregular surface 45a can microscopically form a roughened surface. As a result, as depicted in a lower left enlarged view of FIG. 7, the surface of the projection and depression portion of the metal plated layer can similarly form a roughened surface. More specifically, the upper principal surface of the metal plated layer 50 making contact with the sealing resin layer 40 in the region of the irregular surface 45a forms a roughened surface. In such an electronic part package, since the surface area of the metal plating pattern layer is increased due to not only "the projections and depressions" but also "the roughened surface", it is possible to release heat more efficiently.

In the electronic part package 100 obtained by the production method of the fourth embodiment, the exposed surface of the metal plated layer 50 is formed as a roughened surface. Specifically, as depicted in a lower right enlarged view of FIG. 7, the exposed surface (more specifically, of the principal surfaces of the metal plated layer 50 facing each other, a principal surface located outside) of the metal plated layer 50 forms a roughened surface as a whole. As a result, as is the case with the third embodiment, since the surface area of the metal plating pattern layer is increased due to not only "the projections and depressions" but also "the roughened surface", it is possible to release heat more efficiently.

The third embodiment and the fourth embodiment may be combined. That is, the upper principal surface of the metal plated layer 50 making contact with the sealing resin layer 40 in the region of the irregular surface 45a forms a roughened surface, and the outside principal surface of the metal plated layer 50 may form a roughened surface as a whole. In such a case, the electronic part package 100 may have further improved heat dissipation characteristics.

While the embodiments of the present disclosure have been described, the above descriptions deal only with representative examples. Therefore, it would be easy for a person skilled in the art to understand that the present disclosure is not limited to those embodiments and various other modes are possible.

For example, in the production method of the present disclosure, the separated carrier or subcarrier may be reused. That is, in the present disclosure, "the used carrier or subcarrier" can be used in the production of another electronic part package which is performed later.

Moreover, in the production method of the present disclosure, a plurality of electronic part packages can be produced collectively. Specifically, electronic parts which are used in a plurality of electronic part packages are placed in such a way as to be positioned in a plurality of electronic part installation regions on a carrier, whereby "an electronic part package precursor in which a plurality of precursors are integrated" is obtained collectively. Then, by performing dicing processing after separation processing, it is possible to obtain a plurality of electronic part packages at the same time. That is, by performing dicing processing at any time point after the separation of the carrier in such a way that "the plurality of electronic part installation regions" are separated, it is possible to obtain the plurality of electronic part packages.

The present disclosure can be used in various applications in the electronics packaging field. For example, the present disclosure can be applied to a power supply package (a POL converter, for example, a step-down DC-DC converter), a high-frequency antenna package, a module with built-in parts, and so forth.

What is claimed is:

1. An electronic part package comprising:
    a sealing resin layer provided with a first principal surface including a first region that has a first bellows-like shape having alternate ridges and valleys and a second region that is flat;
    an electronic part that includes an electrode having a second principal surface and is covered by the sealing resin layer except the second principal surface, the second principal surface being surrounded by the second region;
    a metal plating pattern layer integrally provided on the first and second regions and on the second principal surface, wherein a first portion of the metal plating pattern layer, the first portion located on the first region, has a second bellows-like shape having alternate ridges and valleys along an outline of the first region; and
    the first bellows-like shape is locally recessed toward an inside of the sealing resin layer compared to a level of the second region.

2. The electronic part package according to claim 1, wherein
    the second region and the second principal surface of the electrode are located in a same plane, and
    a second portion of the metal plating pattern layer other than the first portion is located in the same plane, facing the second region of the sealing resin layer and the second principal surface of the electrode.

3. The electronic part package according to claim 1, wherein
    the metal plating pattern layer includes a wet-plated layer and a dry-plated layer located nearer to the sealing resin layer than the wet-plated layer,
    the dry-plated layer contains at least one type of metal material selected from a group consisting of Ti, Cr, and Ni, and
    the wet-plated layer contains at least one type of metal material selected from a group consisting of Cu and Al.

4. The electronic part package according to claim 3, wherein
    the electronic part is a light-emitting device,
    the sealing resin layer is a transparent resin layer, and
    the dry-plated layer is a reflecting layer.

5. The electronic part package according to claim 1, wherein the ridges of the first bellows-like shape are located in a same plane as the second region.

6. An electronic part package comprising:
- a sealing resin layer provided with a principal surface including a first region that has a bellows-like shape having alternate ridges and valleys and a second region that is flat;
- an electronic part that includes an electrode having a principal surface and is covered by the sealing resin layer except the principal surface, which is surrounded by the second region; and
- a metal plating pattern layer integrally provided on the first and second regions of the principal surface of the sealing resin layer and on the principal surface of the electrode, wherein a portion of the metal plating pattern layer, the portion located on the first region, has a bellows-like shape having alternate ridges and valleys along an outline of the first region, wherein
- the metal plating pattern layer includes a wet-plated layer and a dry-plated layer located nearer to the sealing resin layer than the wet-plated layer,
- the dry-plated layer contains at least one type of metal material selected from a group consisting of Ti, Cr, and Ni, and
- the wet-plated layer contains at least one type of metal material selected from a group consisting of Cu and Al.

7. The electronic part package according to claim 6, wherein
- the electronic part is a light-emitting device,
- the sealing resin layer is a transparent resin layer, and
- the dry-plated layer is a reflecting layer.

* * * * *